United States Patent
Bialas, Jr. et al.

(10) Patent No.: US 9,627,030 B1
(45) Date of Patent: *Apr. 18, 2017

(54) EFFICIENT CALIBRATION OF A DATA EYE FOR MEMORY DEVICES

(71) Applicant: International Business Machines Corporation, Armonk, NY (US)

(72) Inventors: John S. Bialas, Jr., South Burlington, VT (US); David D. Cadigan, Poughkeepsie, NY (US); Stephen P. Glancy, Poughkeepsie, NY (US); Warren E. Maule, Cedar Park, TX (US); Gary A. Van Huben, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/044,746

(22) Filed: Feb. 16, 2016

Related U.S. Application Data

(63) Continuation of application No. 14/955,183, filed on Dec. 1, 2015.

(51) Int. Cl.
*G11C 11/4076* (2006.01)
*G11C 11/409* (2006.01)

(52) U.S. Cl.
CPC ........ *G11C 11/4076* (2013.01); *G11C 11/409* (2013.01)

(58) Field of Classification Search
CPC .......................... G11C 11/4076; G11C 11/409
See application file for complete search history.

(56) References Cited

U.S. PATENT DOCUMENTS

| | | | |
|---|---|---|---|
| 7,036,053 | B2 | 4/2006 | Zumkehr et al. |
| 8,037,375 | B2 | 10/2011 | Schaefer |
| 8,850,155 | B2 | 9/2014 | Brandl et al. |
| 8,918,686 | B2 | 12/2014 | Lai et al. |
| 8,923,382 | B2 | 12/2014 | Ito et al. |
| 9,401,721 | B1 | 7/2016 | Barakat et al. |
| 2006/0181303 | A1 | 8/2006 | Dreps et al. |
| 2010/0332921 | A1 | 12/2010 | Schaefer |
| 2011/0141827 | A1 | 6/2011 | Mozak et al. |
| 2013/0155788 | A1 | 6/2013 | Brandl et al. |
| 2015/0095565 | A1 | 4/2015 | Morris et al. |
| 2016/0292094 | A1 | 10/2016 | Jeter et al. |

OTHER PUBLICATIONS

Bialas, Jr. et al., "Efficient Calibration of Memory Devices" U.S. Appl. No. 14/970,798, filed Dec. 16, 2015.
Bialas, Jr. et al., "Efficient Calibration of Memory Devices" U.S. Appl. No. 14/955,183, filed Dec. 1, 2015.
Bialas, Jr. et al., "Efficient Calibration of Memory Devices" U.S. Appl. No. 15/044,832, filed Feb. 16, 2016.
Appendix P—List of IBM Patents or Patent Applications Treated as Related.

*Primary Examiner* — Richard Elms
*Assistant Examiner* — Jerome Leboeuf
(74) *Attorney, Agent, or Firm* — Martin & Associates, LLC; Bret J. Petersen

(57) ABSTRACT

A system and method for efficient data eye training reduces the time and resources spent calibrating one or more memory devices. A temporal calibration mechanism reduces the time and resources for calibration by reducing the number tests needed to sufficiently determine the boundaries of the data eye of the memory device. For one or more values of the voltage reference, the temporal calibration mechanism performs a minimal number of tests to find the edges of the data eye for the hold and setup times.

1 Claim, 5 Drawing Sheets

EFFICIENT CALIBRATION OF A DATA EYE FOR MEMORY DEVICES

BACKGROUND

1. Technical Field

This disclosure generally relates to digital memory devices or circuits, and more specifically relates to efficient data eye calibration of memory devices such as double data rate (DDR) memory.

2. Background Art

High speed data links are often used to interface between a memory controller and a double data rate (DDR) synchronous dynamic random access memory (SDRAM) device. A DDR SDRAM interface may receive aligned data (DQ) and read data strobe (DQS) signals from a DDR SDRAM device for transfer to a memory controller. The DDR SDRAM interface or memory controller is responsible for providing the appropriate DQ-DQS timing relationship to provide, for example, an adequate setup and hold time margin within a data valid window. Various methods have been developed for calibrating a data valid window to maintain the read data strobe (DQS) substantially in the center of a defined data valid window for DDR memory applications. Data calibration was first done in the time domain. Subsequently, data calibration has been done in two dimensions that include the time domain and reference voltage (Vref) training. Calibrating the data valid window is sometimes called data "eye" training.

DDR memory calibration or data eye training may be performed at system boot by a basic input/output system (BIOS), a unified extensible firmware interface (UEFI), or a memory controller. Data eye training may be used to place a memory data strobe within the data eye for a given memory cycle. By performing a two-dimensional analysis, it is possible to adjust and/or select the operating Vref(s) for a DDR memory by making tradeoffs between optimized timing and Vref voltage margins. Data eye training may occur on a DRAM by DRAM basis, on a rank by rank basis, on a channel by channel basis, or across all byte lanes.

BRIEF SUMMARY

The disclosure and claims herein provide an efficient system and method for data eye training that reduces the time and resources spent calibrating one or more memory devices. A temporal calibration mechanism reduces the time and resources for calibration by reducing the number of tests needed to sufficiently determine the boundaries of the data eye of the memory device. For one or more values of the voltage reference, the temporal calibration mechanism performs a minimal number of tests to find the edges of the data eye for the hold and setup times.

The foregoing and other features and advantages will be apparent from the following more particular description, as illustrated in the accompanying drawings.

BRIEF DESCRIPTION OF THE SEVERAL VIEWS OF THE DRAWING(S)

The disclosure will be described in conjunction with the appended drawings, where like designations denote like elements, and:

DETAILED DESCRIPTION

The disclosure and claims herein relate to a system and method for data eye training that reduces the time and resources spent calibrating one or more memory devices. A temporal calibration mechanism reduces the time and resources for calibration by reducing the number of tests needed to sufficiently determine the boundaries of the data eye of the memory device. For one or more values of the voltage reference, the temporal calibration mechanism performs a minimal number of tests to find the edges of the data eye for the hold and setup times.

Figure 1:
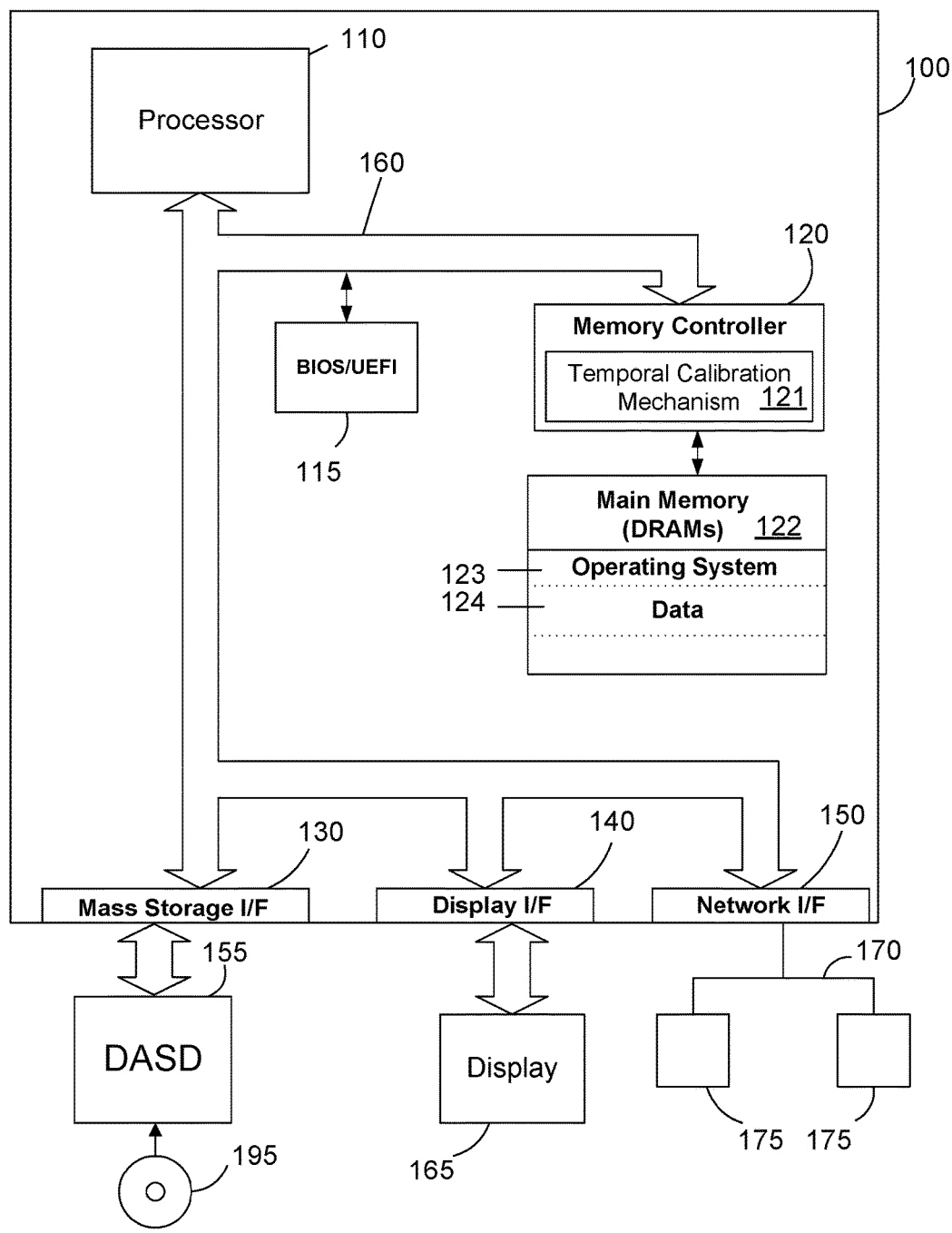
FIG. 1 is a block diagram a computer system with a temporal calibration mechanism described herein.

Referring to FIG. 1, a computer system 100 is one suitable implementation of a computer system that includes a system for data eye training that reduces the time and resources spent calibrating memory devices as described herein. Computer system 100 is a computer which can run multiple operating systems including the IBM i operating system. However, those skilled in the art will appreciate that the disclosure herein applies equally to any computer system, regardless of whether the computer system is a complicated multi-user computing apparatus, a single user workstation, laptop, phone or an embedded control system. As shown in FIG. 1, computer system 100 comprises one or more processors 110, a basic input/output system (BIOS) and/or unified extensible firmware interface (UEFI) 115, a memory controller 120, a main memory 122, a mass storage interface 130, a display interface 140, and a network interface 150. These system components are interconnected through the use of a system bus 160. Mass storage interface 130 is used to connect mass storage devices with a computer readable medium, such as direct access storage devices 155, to computer system 100. One specific type of direct access storage device 155 is a readable and writable CD-RW drive, which may store data to and read data from a CD-RW 195. Some devices may have a removable memory card or similar for a direct access storage device 155 instead of the CD-RW drive.

Main memory 122 preferably contains an operating system 123. Operating system 123 is a multitasking operating system known in the industry as IBM i; however, those skilled in the art will appreciate that the spirit and scope of this disclosure is not limited to any one operating system. The memory further includes data 124. The temporal calibration mechanism 121 shown in the memory controller 120 may alternatively be physically located in the memory 122 and executed by the processor 110. Alternatively, the temporal calibration mechanism 121 may be physically located in the BIOS/UEFI 115.

Computer system 100 utilizes well known virtual addressing mechanisms that allow the programs of computer system 100 to behave as if they only have access to a large, single storage entity instead of access to multiple, smaller storage entities such as main memory 120 and DASD device 155.

Therefore, while operating system 123 and data 124 are shown to reside in main memory 122, those skilled in the art will recognize that these items are not necessarily all completely contained in main memory 122 at the same time. It should also be noted that the term "memory" is used herein generically to refer to the entire virtual memory of computer system 100, and may include the virtual memory of other computer systems coupled to computer system 100.

Processor 110 may be constructed from one or more microprocessors and/or integrated circuits. Processor 110 executes program instructions stored in main memory 122. Main memory 122 stores programs and data that processor 110 may access. When computer system 100 starts up, processor 110 initially executes the program instructions that make up the basic input/output system (BIOS) 115 and later executes the program instructions that make up the operating system 123.

Although computer system 100 is shown to contain only a single processor and a single system bus, those skilled in the art will appreciate that a temporal calibration mechanism may be practiced using a computer system that has multiple processors and/or multiple buses. In addition, the interfaces that are used preferably each include separate, fully programmed microprocessors that are used to off-load compute-intensive processing from processor 110. However, those skilled in the art will appreciate that these functions may be performed using I/O adapters as well.

Display interface 140 is used to directly connect one or more displays 165 to computer system 100. These displays 165, which may be non-intelligent (i.e., dumb) terminals or fully programmable workstations, are used to provide system administrators and users the ability to communicate with computer system 100. Note, however, that while display interface 140 is provided to support communication with one or more displays 165, computer system 100 does not necessarily require a display 165, because all needed interaction with users and other processes may occur via network interface 150, e.g. web client based users.

Network interface 150 is used to connect computer system 100 to other computer systems or workstations 175 via network 170. Network interface 150 broadly represents any suitable way to interconnect electronic devices, regardless of whether the network 170 comprises present-day analog and/or digital techniques or via some networking mechanism of the future. In addition, many different network protocols can be used to implement a network. These protocols are specialized computer programs that allow computers to communicate across a network. TCP/IP (Transmission Control Protocol/Internet Protocol) is an example of a suitable network protocol.

In the illustrated example shown in FIG. 1, the computer system 100 includes a memory controller 120. The memory controller 120 may include a temporal calibration mechanism 121 which is adapted to execute DDR Vref training as described in further detail below. As used herein, the term temporal calibration mechanism may be used to refer the functionality described herein for the temporal calibration mechanism regardless of where it resides.

Again referring to the example in FIG. 1, the computer system 100 may include a basic input/output system (BIOS) and/or unified extensible firmware interface (UEFI) 115 as introduced above. The BIOS/UEFI 115 may include a read-only memory (ROM) and/or one or more caches. The BIOS/UEFI 115 may comprise a silicon die/chip and include software, hardware or firmware components. In other examples, the BIOS/UEFI 115 may be packaged in any silicon die package or electronic component package. In other examples, the BIOS/UEFI 115 may be programmed into an existing computer component. The BIOS/UEFI 115 may reside on a motherboard and be communicatively coupled to the processor 110 via bus connection 160, as shown in FIG. 1. The BIOS/UEFI 115 may include a CPU interface associated with the bus connection 160. The BIOS/UEFI 115 may include the temporal calibration mechanism 121 shown in the memory controller 120.

Figure 2:
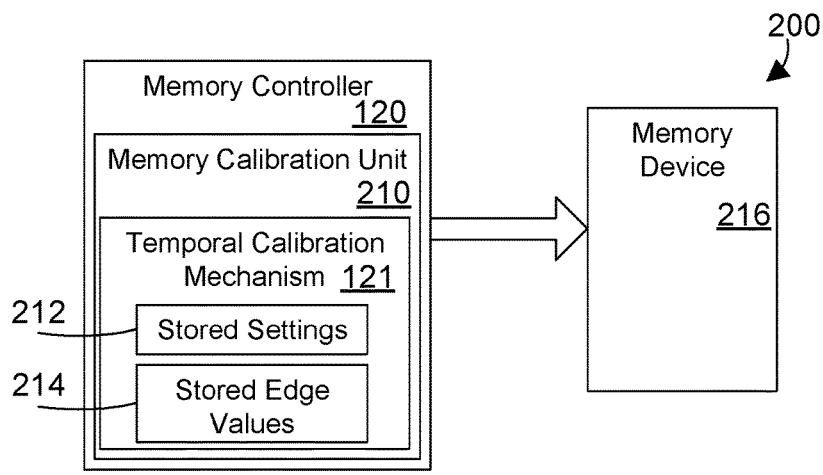
FIG. 2 is a simplified block diagram of a memory controller with a temporal calibration mechanism described herein.

FIG. 2 illustrates a simplified block diagram of a system 200 for data eye training that reduces the time and resources spent calibrating memory device 216. The memory device 216 may be a component of main memory 122 shown in FIG. 1. The system 200 may be part of the computer system 100 as described above. The system 200 includes a memory controller 120 with a memory calibration unit 210. The memory calibration unit 210 may function similar to memory calibration units known in the prior art to calibrate memory devices. The memory calibration unit performs a test by running a pre-determined combination of write and/or read commands to the memory device 216. A fail is declared when there is a discrepancy between the expected data pattern and the incoming pattern read from the memory device. The failure is assumed to be related to the timing changes that have been done internally to the memory controller for the test.

Again referring to FIG. 2, the memory calibration unit 210 in the illustrated example further includes a temporal calibration mechanism 121. The temporal calibration mechanism 121 reduces the time and resources for calibration by reducing the number tests needed to sufficiently determine the edges and area within the boundaries of the data eye of the memory device. The temporal calibration mechanism 121 may include one or more stored settings 212 and one or more stored edge values 214. The stored settings 212 are used to change calibration parameters for a given portion of the memory device. For example, the stored settings 212 are used to set the Vref depending on the portion of the memory device is being accessed similar to the manner known in the prior art. The stored edge values 214 introduced herein can be used to reduce the time needed to determine the data eye edges as described further below. The temporal calibration mechanism 121 performs a minimal number of tests to find the edges of the data eye for the hold and setup times using the stored edge values 214 as described further herein.

Figure 3:
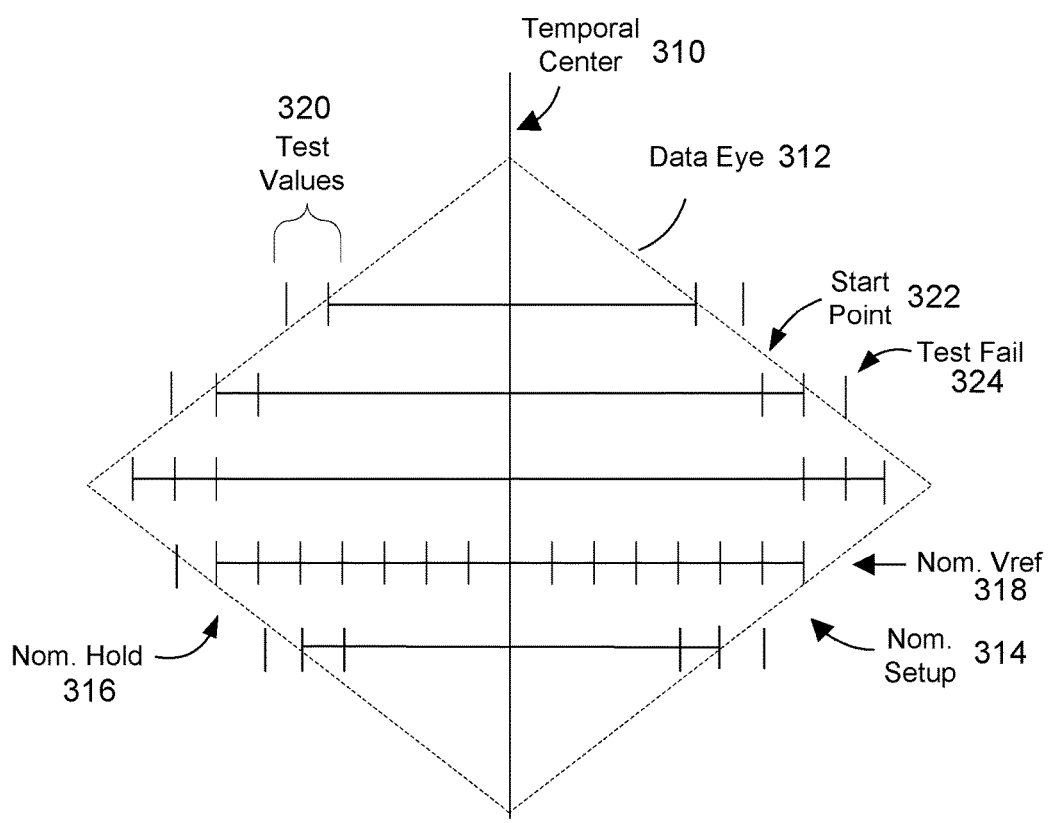
FIG. 3 illustrates simplified temporal calibration by the temporal calibration mechanism.

FIG. 3 is a simplified diagram to illustrate how the temporal calibration mechanism 121 reduces the time and resources for calibration of a memory device. In FIG. 3, the horizontal axis represents different times for a timing signal such as a read data strobe (DQS) signal from a DDR SDRAM. One of ordinary skill in the art will recognize that the same diagram would similarly apply for a write data signal. The vertical axis is the temporal center 310. The values of the horizontal axis on the right represent nominal setup time 314 and the values on the left represent a nominal hold time 316 for a memory strobe signal such as the DQS signal described above. The vertical axis in FIG. 3 corresponds to various reference voltages used for a Vref signal applied to the memory device 216. Two-dimensional analysis is done to adjust and/or select the operating Vref(s) for a memory device by making tradeoffs between optimized timing and Vref voltage margins.

In FIG. 3, the data eye 312 represents a simplified view of the range of voltages and timing that can successfully access the memory device. The Vref training is done to place a memory data strobe within the data eye 312 for a given memory cycle. A Vref voltage that achieves an optimum tradeoff in the data eye 312 is stored in the stored settings 212 in FIG. 2 and used to access the memory device in a similar manner as known in the prior art. The shape of the data eye 312 is shown here as diamond shaped. While the real shape of a data eye is not precisely diamond shaped, it is often simplified to the diamond shape as shown for illustration purposes.

Again referring to FIG. 3, the temporal calibration mechanism 121 reduces the time and resources for calibration of the memory device by reducing the number of tests needed to sufficiently determine the edges and area of the data eye 312 for the memory device 216. In FIG. 3, each small vertical line at each level of Vref represents a test value 320. For each test value shown with a vertical line, the corresponding Vref and timing are used to test the memory device. If the test results in good data, then the location of the test value can be considered to be within the data eye 312. In the prior art, tests were run at each interval (not shown) along each Vref to determine the area of the data eye 312. As described herein, the temporal calibration mechanism 121 reduces the time and resources for calibration of the memory device by eliminating many tests within the boundaries of the data eye 312 where the test should pass and does not need to be tested. Tests are eliminated by testing just at or near the boundaries on the right and left of the data eye 312 as shown. The test for the boundaries can start at the outer edge of the data eye or some determined step inwards from the outer boundary. The temporal calibration mechanism 121 starts testing from a start point 322 and continues with tests at incremental intervals until there is a test failure 324 that indicates the timing is outside the data eye 312. It can thus be determined that the edge of the data eye for the current voltage reference lies between the last two tests.

For the nominal Vref 318, tests may be done across the entire length of the data eye similar to what is done in the prior art. This may be done to establish a baseline for the width of the data eye 312. For subsequent values of Vref, a reduced number of tests may be done to establish the data eye 312 while saving significant time and resources. For the subsequent values of Vref, a first test, or safety check can be done just at the midpoint between the left edge and right edge, essentially, the best case temporal setting from the previously run Vref. The reason for doing the safety check for the subsequent Vrefs is that, while moving along the reference voltages, it is possible the tests may have moved outside of the data eye and thus fail the test. The safety check can determine that an upper or lower boundary of the data eye has been hit for the current Vref in one test rather than taking multiple tests to find this boundary. If the safety check passes, then the temporal calibration mechanism 121 may continue with calibration tests to determine the edges of the data eye as described further below. The Vref that gives the widest or best case temporal data eye is generally chosen to be used during run time. The best case Vref may be stored in the stored settings 212 (FIG. 2) in the memory controller to set the Vref to be used to access to the memory during run time. A full temporal calibration (full set of tests at each time increment) can optionally be run on the chosen or best case Vref to get an accurate set of data for this Vref.

As discussed above, a safety check may be done for each Vref. to determine if an upper or lower boundary of the data eye has been hit for the current Vref. If the safety check fails, it may not necessarily indicate the boundary of the data eye. If the sanity check fails at a new Vref it may be due to ringing or ring back. Ring back may limit the eye temporally or in the Vref. domain but the data eye may not be completely affected. In other words, the data eye may have an hour glass shape (temporal effect) or a bow-tie shape (Vref effect) rather than the shape shown in FIG. 3. If the safety check fails, the temporal calibration mechanism 121 may optionally run the calibration tests through the whole temporal range, checking for the ring back effect. While running tests on the whole temporal ranges for the current Vref, the temporal calibration mechanism may detect one or more passing regions. The largest passing region may be selected as the data eye. An alert or alarm can be sent to the user if ring back is detected.

Additional tests can be eliminated by storing edge values 214 (FIG. 2). When testing the device for the first time the left and right edges of the eye are not known. As such, a full temporal calibration can be done at the nominal Vref 318 as shown to determine these edges. This full temporal calibration can provide the location of the data eye 312 edge that can be saved as stored edge values 214. On subsequent tests, the stored edge values 214 can be used so that testing can begin again at or near the edges of the data eye 312 and thus eliminate the need for testing along the entire length of nominal Vref 318.

As introduced above, calibration tests are eliminated by testing just at or near the boundaries on the right and left of the data eye. The temporal calibration mechanism first determines an appropriate starting point and then steps outward to find an edge of the data eye for each value of the voltage reference. The appropriate starting point may be determined by examining the full temporal test of the nominal Vref and stepping in a small increment in time from the edge of the data eye at the nominal Vref. From this starting point, the temporal calibration mechanism then steps outward to find the data eye edge for the current Vref. The temporal calibration mechanism thus determines the edges of the data eye for a plurality of voltage reference levels by beginning at a first suitable start time near the left edge of the data eye and then stepping a number of tests toward the left edge until a failure indicates the edge is found. Similarly, a suitable time is used to begin testing near the right edge of the data eye and then stepping a number of tests toward the right edge of the data eye. To step to the edge, timing delays are changed (either an increase or a decrease in value) until a data fail is encountered. If the calibration is being done in hardware, the hardware will automatically update the values. If the calibration is being done in software, then a command will be issued to the software to update the values or a command will be issued to program in the new delay value. When a delay value produces a failure, the previous or last passing timing delay value is considered to be the edge of the eye. The last passing delay value is stored as the edge of the current Vref. The edge of the current Vref can then be used to determine where to start stepping for subsequent values of Vref.

Figure 4:
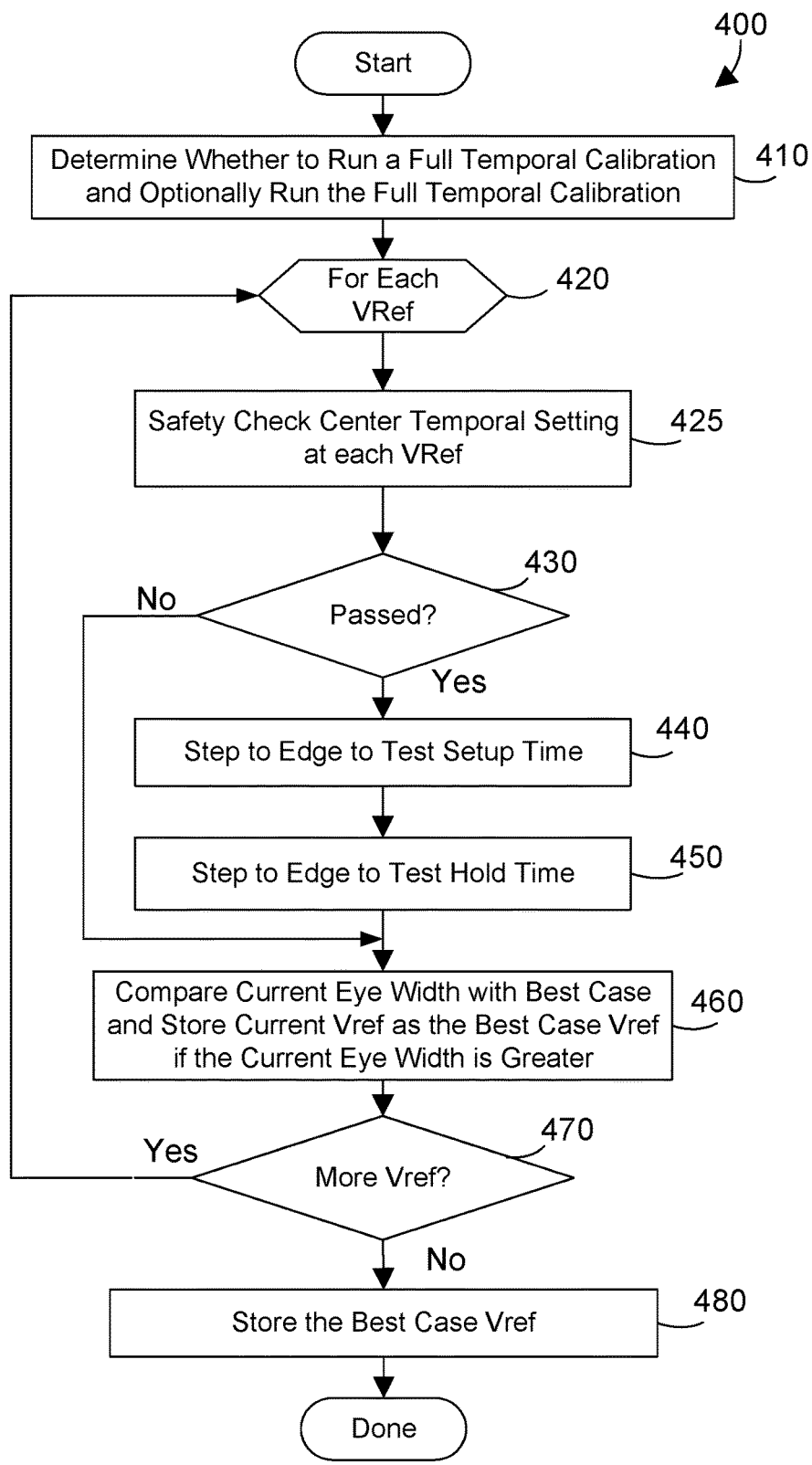
FIG. 4 is a flow diagram of a method for a system for a temporal calibration mechanism to calibrate a memory device.

Referring to FIG. 4, a method 400 shows one suitable example for data eye training that reduces the time and resources spent calibrating a memory device. Portions of method 400 are preferably performed by the temporal calibration mechanism 121 described above and shown in FIGS. 1 and 2. First, determine whether to run a full temporal calibration and optionally run a full temporal calibration (step 410). Then, for each Vref (step 420) safety check the center temporal setting (step 425). If the safety check didn't pass (step 430=No) then go to step 460 to check for the next Vref. If the safety check passed (step 430=Yes) then step to the edge to find the test setup time (step 440). Step to the edge to test the test hold time (step 450). Compare the current eye width for the current Vref with the eye width of the previous best case Vref and store the current Vref as the best case Vref if the current eye width is greater than the eye width for the previous best case Vref (step 460). If there are more reference Vrefs (step 470=yes) then go to step 420 for the next Vref. If there are no more reference Vrefs (step 470=no) then store the best case Vref with the best case temporal eye width to use at run time (step 480) and the method 400 is then done.

Figure 5:
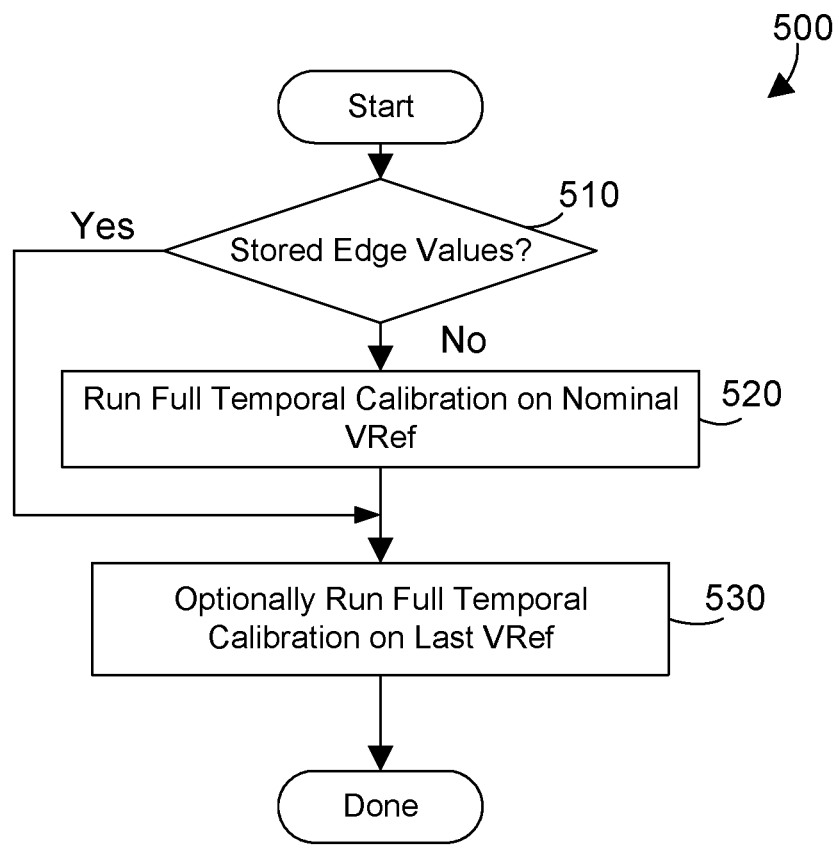
FIG. 5 is a flow diagram of a specific method for step 410 in FIG. 4.

FIG. 5 shows one suitable example of a method 500 for determining whether to run a full temporal calibration. Method 500 thus shows a suitable method for performing step 410 in method 400. First, determine if there are stored edges available (step 510). If there are stored edges available (step 510=yes) then optionally run the full temporal calibration on the best case or widest Vref (step 530) and the method is done. If there are no stored edges available (step 510=no) then run a full temporal calibration on the nominal Vref (step 520). Then, optionally run the full temporal calibration on the best case or widest Vref (step 530). The method is then done.

Figure 6:
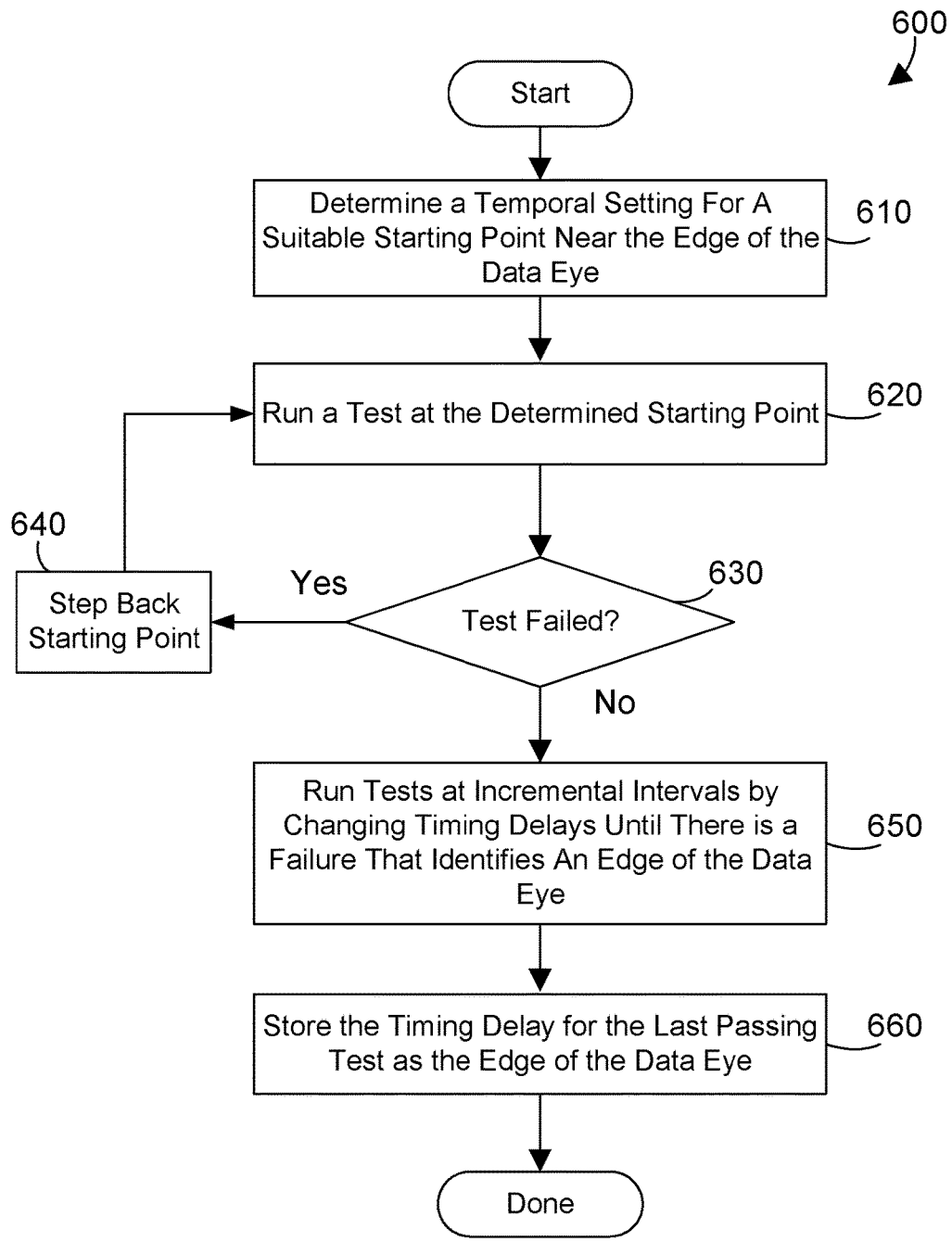
FIG. 6 is a flow diagram of a specific method for step 440 in FIG. 4.

FIG. 6 shows one suitable example of a method 600 for stepping to the edge of the data eye to find the boundary for the test setup time. Method 600 thus shows a suitable method for performing step 440 or step 450 in method 400. First, determine a temporal setting for a suitable starting point near the edge of the data eye (step 610). Run a test at the determined starting point (step 620). If the test failed (step 630=yes) then step back the starting point (step 640) and return to step 620. If the test did not fail (step 630=no) then run tests at incremental intervals by changing timing delays until there is a failure that identifies an edge of the data eye (step 650). Store the location of the edge of the data eye. The method is then done.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The disclosure and claims herein relate to a system for data eye training that reduces the time and resources spent calibrating one or more memory devices. A temporal calibration mechanism reduces the time and resources for calibration by reducing the number tests needed to sufficiently determine the meets and bounds of the data eye of the memory device.

One skilled in the art will appreciate that many variations are possible within the scope of the claims. Thus, while the disclosure is particularly shown and described above, it will be understood by those skilled in the art that these and other changes in form and details may be made therein without departing from the spirit and scope of the claims.

The invention claimed is:

1. An apparatus for calibrating a memory device comprising:
   a memory calibration unit that tests combinations of timing and reference voltages applied to the memory device to determine a data eye for a data strobe signal;
   a temporal calibration mechanism determines the boundaries of the data eye by determining the edges of the data eye for a plurality of voltage reference levels by beginning at a first suitable start time near a first edge of the data eye and then stepping a first number of tests toward the first edge of the data eye, and then by beginning at a second suitable start time near a second edge of the data eye and then stepping a second number of tests toward the second edge of the data eye; and
   wherein stored edge values from a previous test are used for the first suitable start time and the second suitable start time.

* * * * *